(12) United States Patent
Nagaoka et al.

(10) Patent No.: US 10,244,617 B2
(45) Date of Patent: Mar. 26, 2019

(54) POWER CONVERTER

(71) Applicant: OMRON Corporation, Kyoto-shi, Kyoto (JP)

(72) Inventors: Shingo Nagaoka, Kizugawa (JP); Hiroyuki Onishi, Kyoto (JP); Takeo Nishikawa, Kyoto (JP); Kentaro Hamana, Okayama (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/785,563

(22) Filed: Oct. 17, 2017

(65) Prior Publication Data

US 2018/0042104 A1 Feb. 8, 2018

Related U.S. Application Data

(63) Continuation of application No. PCT/JP2016/057180, filed on Mar. 8, 2016.

(30) Foreign Application Priority Data

Jun. 30, 2015 (JP) .................................. 2015-131439

(51) Int. Cl.
| | |
|---|---|
| *H05K 1/02* | (2006.01) |
| *H02M 1/44* | (2007.01) |
| *H02M 3/155* | (2006.01) |
| *H02M 7/48* | (2007.01) |
| *H01L 23/433* | (2006.01) |

(Continued)

(52) U.S. Cl.
CPC ........... *H05K 1/0216* (2013.01); *H01L 23/36* (2013.01); *H01L 23/4332* (2013.01);
(Continued)

(58) Field of Classification Search
None
See application file for complete search history.

(56) References Cited

U.S. PATENT DOCUMENTS

| | | | |
|---|---|---|---|
| 5,459,348 A | 10/1995 | Smith | |
| 5,616,955 A * | 4/1997 | Yamada | ................ H01L 25/072 |
| | | | 257/690 |

(Continued)

FOREIGN PATENT DOCUMENTS

| | | |
|---|---|---|
| JP | H9-298889 | 11/1997 |
| JP | H11-356047 A | 12/1999 |

(Continued)

OTHER PUBLICATIONS

The extended European search report dated May 14, 2018 in a counterpart European patent application.

(Continued)

*Primary Examiner* — Mukundbhai G Patel
(74) *Attorney, Agent, or Firm* — Metrolexis Law Group, PLLC

(57) ABSTRACT

Provided is a power converter which is applied to a power converter equipped with a switching element provided on a line, and a radiator connected to a predetermined potential such as a ground potential. A noise eliminator in which a conductive member is covered with insulator is provided between the switching element (semiconductor switch) and the radiator (heatsink). A flexible connecting line connected to a conductive member of the noise eliminator is connected to an on-board line disposed on a circuit board.

8 Claims, 10 Drawing Sheets

(51) Int. Cl.
  *H05K 1/18* (2006.01)
  *H01L 23/36* (2006.01)
  *H01L 23/522* (2006.01)

(52) U.S. Cl.
  CPC .......... *H01L 23/5222* (2013.01); *H02M 1/44* (2013.01); *H02M 3/155* (2013.01); *H02M 7/48* (2013.01); *H05K 1/181* (2013.01); *H05K 1/0209* (2013.01); *H05K 2201/0311* (2013.01); *H05K 2201/066* (2013.01); *H05K 2201/0792* (2013.01); *H05K 2201/10166* (2013.01); *H05K 2201/10265* (2013.01); *H05K 2201/10356* (2013.01); *H05K 2201/10628* (2013.01); *H05K 2201/10757* (2013.01)

(56) References Cited

U.S. PATENT DOCUMENTS

| | | | |
|---|---|---|---|
| 8,242,375 B2* | 8/2012 | Hertel | H01L 23/49822 174/255 |
| 9,913,356 B2* | 3/2018 | Rostamzadeh | H05B 41/24 |
| 2004/0164405 A1 | 8/2004 | Umezu et al. | |
| 2011/0198919 A1* | 8/2011 | Hattori | B60L 11/1811 307/9.1 |
| 2011/0272181 A1 | 11/2011 | Koo et al. | |
| 2016/0315038 A1* | 10/2016 | Sato | H01L 25/00 |

FOREIGN PATENT DOCUMENTS

| | | | |
|---|---|---|---|
| JP | 2007-213690 A | | 8/2007 |
| JP | 2013-34304 A | | 2/2013 |
| JP | 2013-106503 A | | 5/2013 |
| JP | 2014-54114 A | | 3/2014 |
| WO | WO 2015/142375 | * | 9/2015 |

OTHER PUBLICATIONS

An English translation of the International Search Report of PCT/JP2016/057180 dated May 31, 2016.

An English translation of the Written Opinion of PCT/JP2016/057180 dated May 31, 2016.

* cited by examiner

POWER CONVERTER

CROSS REFERENCE TO RELATED APPLICATIONS

This application is a continuation application of International Application No. PCT/JP2016/057180, filed on Mar. 8, 2016, which claims priority based on the Article 8 of Patent Cooperation Treaty from prior Japanese Patent Application No. 2015-131439, filed on Jun. 30, 2015, the entire contents of which are incorporated herein by reference.

TECHNICAL FIELD

The disclosure relates to a power converter equipped with a line provided on a circuit board, a switching element provided on the circuit board and connected to the line, and a radiator provided on the circuit board.

BACKGROUND ART

A power converter is used in various applications, in which a semiconductor switch is switched to control an output voltage and/or an output current. To the power converter is attached a heatsink to radiate heat generated by the semiconductor switch.

FIG. 1 is a schematic side view schematically showing a semiconductor switch equipped on a power converter and an outer appearance of an attached heatsink. FIG. 1 shows a semiconductor switch SW equipped on the power converter. The semiconductor switch SW is attached with a heatsink HS and is fixed on a circuit board B. The heatsink HS has a function of cooling by externally radiating heat generated on the semiconductor switch SW.

However, when the heatsink HS is connected to an FG (frame ground), a parasitic capacitance is generated between the semiconductor switch SW and the heatsink HS.

FIG. 2 is an explanatory diagram schematically depicting the heatsink in a circuit diagram related to the semiconductor switch equipped on the power converter. FIG. 2 shows a circuit in which the semiconductor switch SW is provided to short-circuit between a pair of lines connecting an input side and an output side, and the heatsink HS is shown on the right side of the semiconductor switch SW. The heatsink HS is connected to the FG. Further, a parasitic capacitance Chp is generated between the semiconductor switch SW and the heatsink HS. The generated parasitic capacitance Chp transfers to the FG a voltage fluctuation at a point P1 connected to the positive terminal of the semiconductor switch SW, and whereby a common mode current Icm flows as noise.

FIG. 3 is a graph showing a voltage change at the point P1 of the power converter. FIG. 3 shows a temporal change of a voltage V1 at the point P1, where the horizontal axis represents time and the vertical axis represents the voltage at the point P1. Because the temporal change of the voltage V1 at the point P1 shown in FIG. 3 is transferred to the FG through the parasitic capacitance Chp, the temporal change of the voltage V1 is output as noise to the input side of the power converter.

As described above, when the heatsink HS is connected to the FG, large noise depending on the voltage fluctuation at the point P1 is output to the input side of the power converter. The magnitude of the common mode current Icm to be transferred to the FG and to become noise is represented by the following Equation (A).

$$Icm = Chp \times dV/dt \qquad \text{Equation (A)}$$

where
Icm is a common mode current,
Chp is a parasitic capacitance between the semiconductor switch SW and the heatsink HS,
V is a voltage V1 at the point P1, and
t is time.

The parasitic capacitance Chp is represented by the following Equation (B).

$$Chp = \varepsilon \cdot S/dhp \qquad \text{Equation (B)}$$

where
$\varepsilon$ is a permittivity between the semiconductor switch SW and the heatsink HS,
dhp is a distance between the semiconductor switch SW and the heatsink HS, and
S is an area of the electrode.

In order to reduce the above-mentioned noise, Patent Document 1 proposes a method in which a low-permittivity insulation material using ceramics is provided between the semiconductor switch and the heatsink to reduce the parasitic capacitance generated between the semiconductor switch and the heatsink. Because the parasitic capacitance is reduced, the parasitic capacitance Chp in the above Equation (A) is accordingly reduced, and whereby the common mode current Icm can be smaller.

Further, as another method for reducing the noise, Patent Document 2 proposes a method in which the heatsink itself is connected to a stable potential so that the current causing the noise will be enclosed in a circuit.

PRIOR ART DOCUMENTS

Patent Documents

Patent Document 1: Japanese Unexamined Patent Publication No. H9-298889
Patent Document 2: Japanese Unexamined Patent Publication No. H11-356047

SUMMARY OF THE INVENTION

Problems to be Solved by the Invention

However, the method proposed in Patent Document 1 has a problem that the semiconductor switch cannot be sufficiently cooled because of a thermal resistance of the insulation material provided between the semiconductor switch and the heatsink. In addition, there is caused another problem that the ceramics used as the insulation material is expensive so that a cost of the power converter becomes higher.

Further, in the method proposed in Patent Document 2, when the heatsink is used while being fixed to a casing, it is necessary to provide an insulation distance between a ground potential and the stable potential because the casing is at the ground potential. Therefore, there is caused a problem that a larger space needs to be provided for the heatsink to be disposed in, and this problem leads to another problem such as restriction of arrangement of other elements. Further, the bolt for fixing the heatsink must be made of insulation material. If resin material is used as an insulation material bolt, the strength is not enough, and if ceramics is used, the cost of the power converter becomes higher. On the other hand, if the heatsink is not fixed on the casing, the heatsink needs to be fixed at many positions to ensure fixing strength, and there is a problem such as restriction of arrangement of other elements.

One or more aspects have been made in view of these circumstances, and an insertion member having an insulator and a conductive member is provided between the switching element and radiator, where the conductive member and a line on a circuit board are connected to each other by a flexible connecting line. One or more aspects may provide a power converter in which the noise can be reduced with the above arrangement without causing the problems described in association with Patent Document 1 and Patent Document 2 and in which an influence of vibration or the like can be reduced and the durability is thus high.

Means for Solving the Problem

In order to solve the above problem, a power converter according to one or more aspects includes: a line provided on a circuit board; a switching element provided on the circuit board and connected to the line; a radiator provided on the circuit board; and an insertion member provided between the switching element and the radiator. The insertion member includes: a conductive member; an insulator provided between the conductive member and the switching element and between the conductive member and the radiator; and a connecting line which is flexible and electrically connects the conductive member and the line to each other.

Further, the power converter includes an engagement member provided on the circuit board and electrically connected to the line, and the connecting line includes a terminal freely movably engaged with the engagement member.

Further, in the power converter, the engagement member is a pivot support pin one end of which is fixed to the line. The terminal included in the connecting line has a through hole provided therein, and the through hole is freely fit to the pivot support pin.

Further, in the power converter, the connecting line includes a bellows member formed in a bellows shape.

Further, in the power converter, the connecting line includes a helical member formed in a helical shape.

Further, in the power converter, the line is a pair of lines connecting between an input side and an output side, the switching element is provided to short-circuit between the pair of lines, one of the pair of lines is connected to a stable potential, the connecting line electrically connects the conductive member to the one of the pair of lines connected to the stable potential, and the radiator is electrically connected to a predetermined potential.

In the power converter according to one or more aspects, noise caused by a parasitic capacitance can be enclosed in a circuit, and the flexibility of a connecting line reduces an influence of vibration or the like.

Effect of the Invention

In one or more aspects, an insertion member having an insulator and a conductive member is provided between a switching element and a radiator, and the conductive member and a line on a circuit board are connected to each other by a flexible connecting line. This arrangement enables a noise current to flow to the line side, the noise current being based on parasitic capacitances generated between the conductive member and the switching element and between the conductive member and the radiator. Therefore, the noise is enclosed in a circuit, and an excellent effect is provided. For example, the noise which is output to the input side of the power converter can be reduced. In addition, because the connecting line connecting the conductive member and the line is flexible, an excellent effect is provided. For example, it is possible to reduce the influence of a physical stimulation such as vibration.

MODE FOR CARRYING OUT THE INVENTION

Hereinafter, embodiments will be described with reference to the drawings. Note that the following embodiments are examples in which the present invention is embodied, and the embodiments are not intended to limit the technical scope of the present invention.

<Outer Appearance and Shapes>

Figure 1:
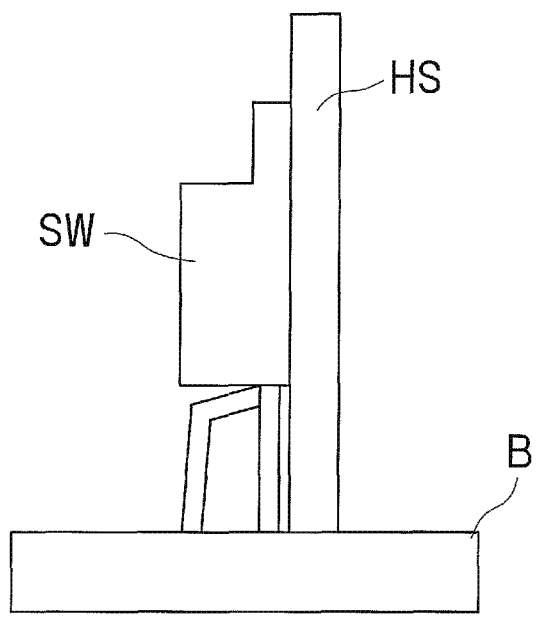
FIG. 1 is a schematic side view schematically illustrating an outer appearance of a semiconductor switch equipped on a power converter and an attached heatsink.
Figure 2:
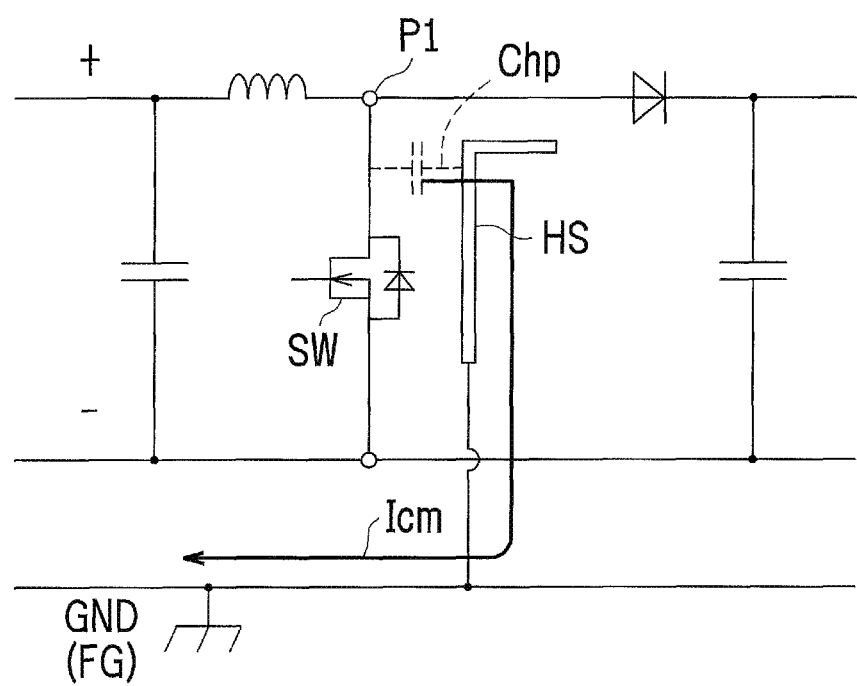
FIG. 2 is an explanatory diagram schematically illustrating a heatsink on a circuit diagram related to a semiconductor switch equipped on a power converter.
Figure 3:
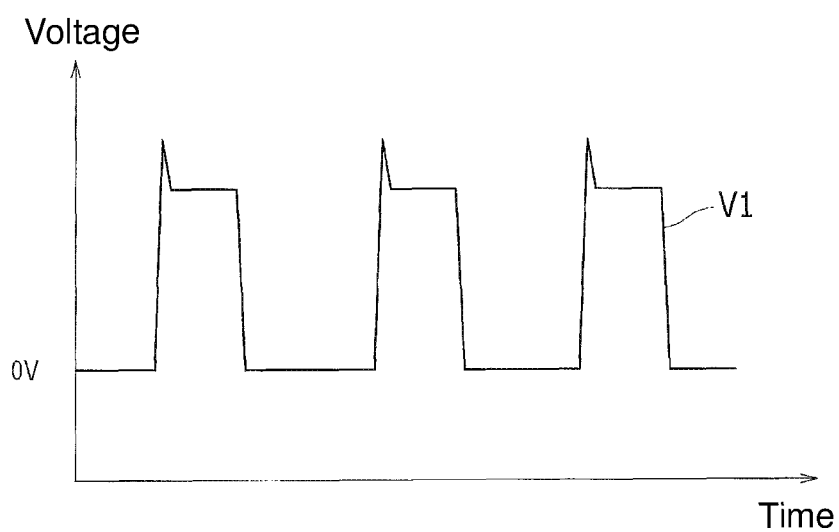
FIG. 3 is a graph illustrating a voltage change at a point in a power converter.
Figure 4:
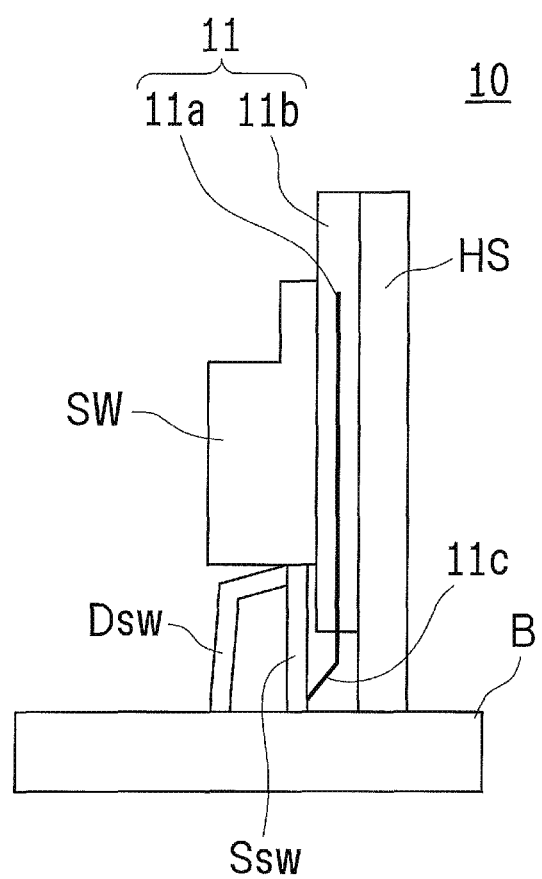
FIG. 4 is a schematic side view schematically illustrating an example of an outer appearance of a power converter according to one or more embodiments.
Figure 5:
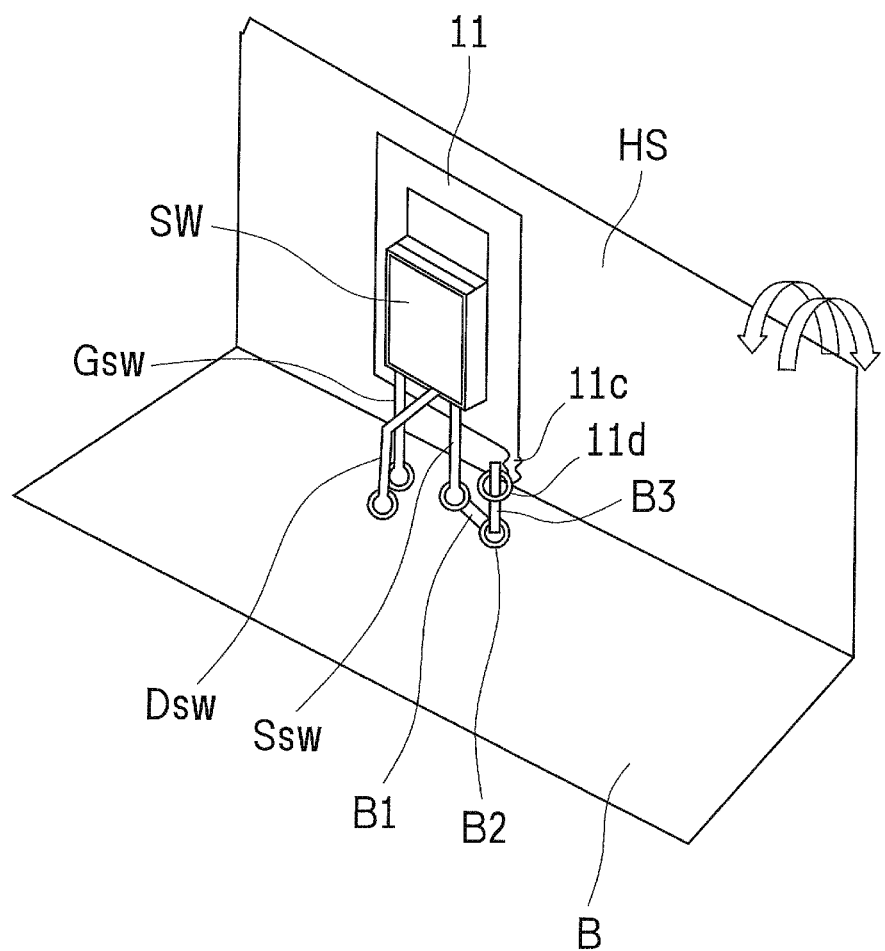
FIG. 5 is a schematic perspective view schematically illustrating an example of an outer appearance of a power converter according to one or more embodiments.
Figure 6:
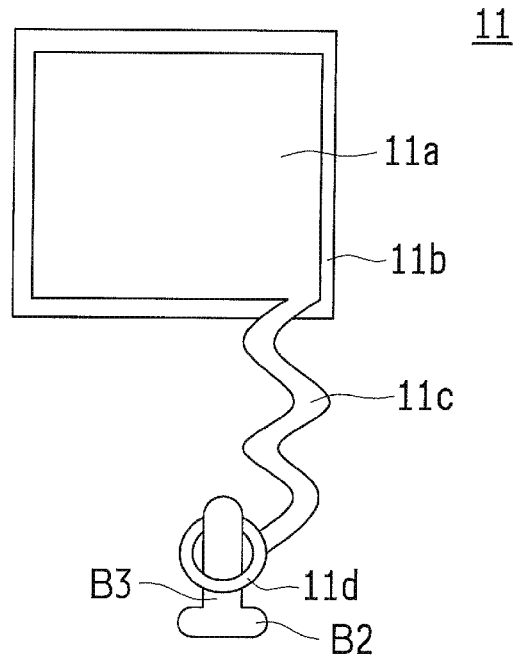
FIG. 6 is a schematic diagram schematically illustrating an example of a noise eliminator and a pivot support pin equipped on a power converter according to one or more embodiments.

FIG. 4 is a schematic side view schematically showing an example of an outer appearance of a power converter according to one or more embodiments. FIG. 5 is a schematic perspective view schematically showing an example of an outer appearance of the power converter according to one or more embodiments. FIG. 6 is a schematic diagram schematically showing an example of a noise eliminator and a pivot support pin equipped on the power converter according to one or more embodiments. A power converter 10 according to one or more embodiments is a device such as an inverter or a DC/DC converter in which a semiconductor switch SW is used to perform control of conversion of an output voltage and/or an output current.

The semiconductor switch SW is configured with a semiconductor switching element such as a MOSFET (Metal-Oxide-Semiconductor Field-Effect Transistor) or an IGBT (Insulated Gate Bipolar Transistor). The semiconductor switch SW is fixed on a circuit board B by using a source terminal Ssw, a gate terminal Gsw, and a drain terminal Dsw which function as legs. Further, on the circuit board B is vertically provided a heatsink (radiator) HS which has a function of cooling by externally radiating heat generated on the semiconductor switch SW. The heatsink HS is approximately perpendicular to the upper surface of the circuit board B, and the heatsink HS is electrically connected to an FG (frame ground) to be described later. Further, on the circuit board B, a noise eliminator (insertion member) 11 is provided between the semiconductor switch SW and the heatsink HS, and the noise eliminator 11 reduces a noise current flowing, from a parasitic capacitance generated between the semiconductor switch SW and the heatsink HS, to the input side of the power converter 10.

The noise eliminator 11 is equipped with a thin-film shaped conductive member 11a such as a copper foil, an insulator 11b covering the conductive member 11a, and a connecting line 11c connected to the conductive member 11a. The conductive member 11a is electrically connected to an on-board line B1 provided on the circuit board B, through the flexible connecting line 11c. The noise eliminator 11 has a thin-film shape in which the thin-film shaped conductive member 11a is covered with the thin-film shaped insulator (insulating film) 11b, and one surface of the insulator 11b is stuck to the semiconductor switch SW, and the other surface is stuck to the heatsink HS. Specifically, the conductive member 11a is disposed between the semiconductor switch SW and the heatsink HS, and the insulator 11b is disposed, as an insulating film, between the conductive member 11a and the semiconductor switch SW and between the conductive member 11a and the heatsink HS. Further, in order to increase an efficiency of heat transfer at which the heat generated on the semiconductor switch SW is transferred to the heatsink HS through the noise eliminator 11, the semiconductor switch SW has a heat radiation surface to be stuck to one surface of the noise eliminator 11, and the heatsink HS has a heat absorption surface to be stuck to the other surface of the noise eliminator 11.

On one end side of the on-board line B1 provided on the circuit board B is fixed the source terminal Ssw, and on a line terminal B2 on the other end side is fixed a conductive pivot support pin B3 as an engagement member. The pivot support pin B3 has a rod shape and is vertically disposed to be approximately perpendicular to the upper surface of the circuit board B while one end of the pivot support pin B3 is fixed on the line terminal B2. Further, the end of the connecting line 11c extending from the conductive member 11a of the noise eliminator 11 is formed to be a conductive annular terminal 11d in which a through hole is made, and the annular terminal 11d is freely fit to the pivot support pin B3 via the through hole and is freely movably engaged with the pivot support pin B3. Because the annular terminal 11d is engaged with the pivot support pin B3, the conductive member 11a of the noise eliminator 11 is electrically connected to the on-board line B1 and the source terminal Ssw.

The connecting line 11c is made up of a thin film having an elongated shape and is made longer than the distance between the connection position of the connecting line 11c to the conductive member 11a and the on-board line B1. Therefore, even when a physical vibration occurs in a direction of the hollow arrows in FIG. 5, the longish part of the connecting line 11c absorbs the vibration by the flexibility, and whereby it is possible to reduce occurrence of abnormality such as fracture at the connection part or break caused by physical stimulation such as vibration. In particular, in the form exemplified in FIG. 5, because the annular terminal 11d is freely movably engaged with the pivot support pin B3, physical stimulation such as vibration can be absorbed also by the free movement of the annular terminal 11d, and whereby occurrence of abnormality can be effectively reduced.

Figure 7A:
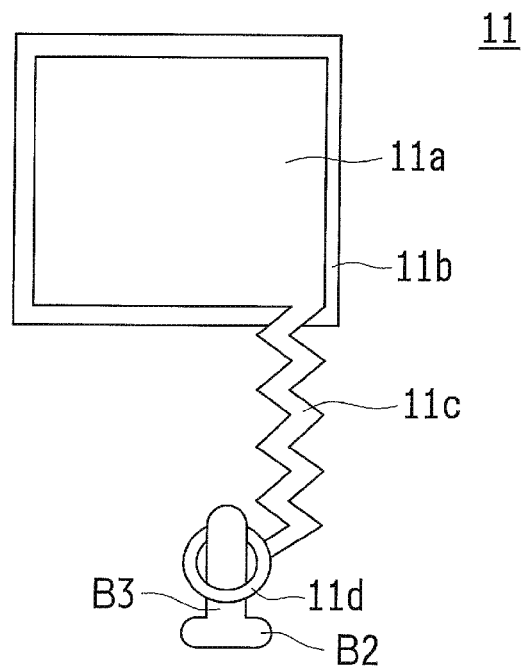
FIG. 7A is a schematic diagram schematically illustrating another example of a noise eliminator equipped on a power converter of one or more embodiments.
Figure 7B:
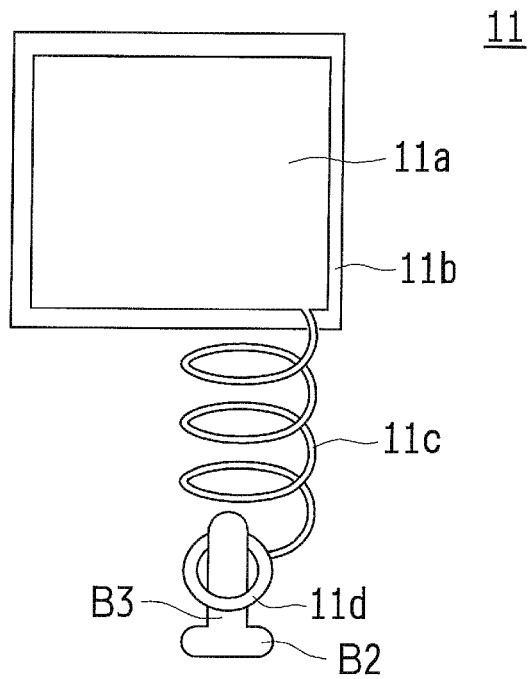
FIG. 7B is a schematic diagram schematically illustrating another example of a noise eliminator equipped on a power converter of one or more embodiments.
Figure 7C:
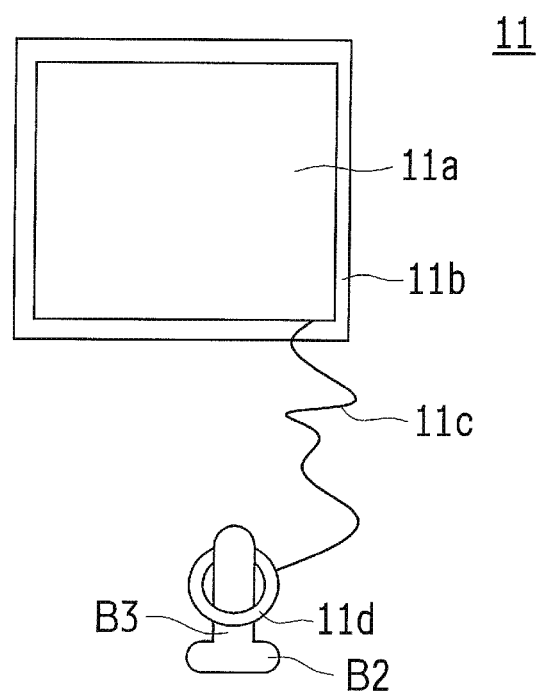
FIG. 7C is a schematic diagram schematically illustrating another example of a noise eliminator equipped on a power converter of one or more embodiments.

The flexible connecting line 11c exemplified in FIG. 4 to FIG. 6 can be formed in various shapes. FIG. 7A to FIG. 7C are schematic diagrams each schematically showing another example of the noise eliminator 11 equipped on the power converter 10 according to one or more embodiments. FIG. 7A shows a form in which the connecting line 11c using a thin film having an elongated shape is made in a bellows shape. With respect to physical stimulation such as vibration, the connecting line 11c made in a bellows shape can absorb the vibration by the bellows member expanding and contracting while bending.

FIG. 7B shows a form in which the connecting line 11c using a thin film having an elongated shape is made in a helical shape. With respect to physical stimulation such as vibration, the connecting line 11c made in a helical shape can absorb the vibration by the helical member expanding and contracting as a spring.

FIG. 7C shows a form in which the connecting line 11c is made of a threadlike conductive member. FIG. 7C shows a form in which a threadlike conductive member (for example, an elongated copper wire) is used in a slack manner, and the threadlike conductive member is sufficiently longer than the distance between the connection position of the connecting line 11c to the conductive member 11a and the on-board line B1. In the connecting line 11c using a sufficiently long threadlike conductive member, the slack part can absorb physical stimulation such as vibration, so that the vibration can be prevented from being transferred.

Figure 8:
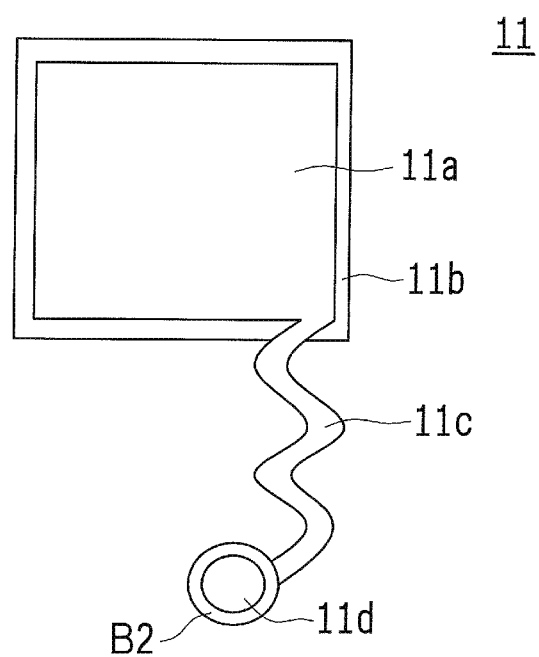
FIG. 8 is a schematic diagram schematically illustrating another example of a noise eliminator equipped on a power converter of one or more embodiments.

FIG. 8 is a schematic diagram schematically showing another example of the noise eliminator 11 equipped on the power converter 10 according to one or more embodiments. The noise eliminator 11 exemplified in FIG. 8 has a form in which the end of the connecting line 11c is directly fixed on the line terminal B2 without using a pivot support pin B3. Even in the case that the end of the connecting line 11c is directly fixed on the line terminal B2 without using a pivot support pin B3, if the connecting line 11c is sufficiently long and flexible, it is possible to absorb vibration of physical stimulation such as vibration.

<Circuit Configuration>

Figure 9:
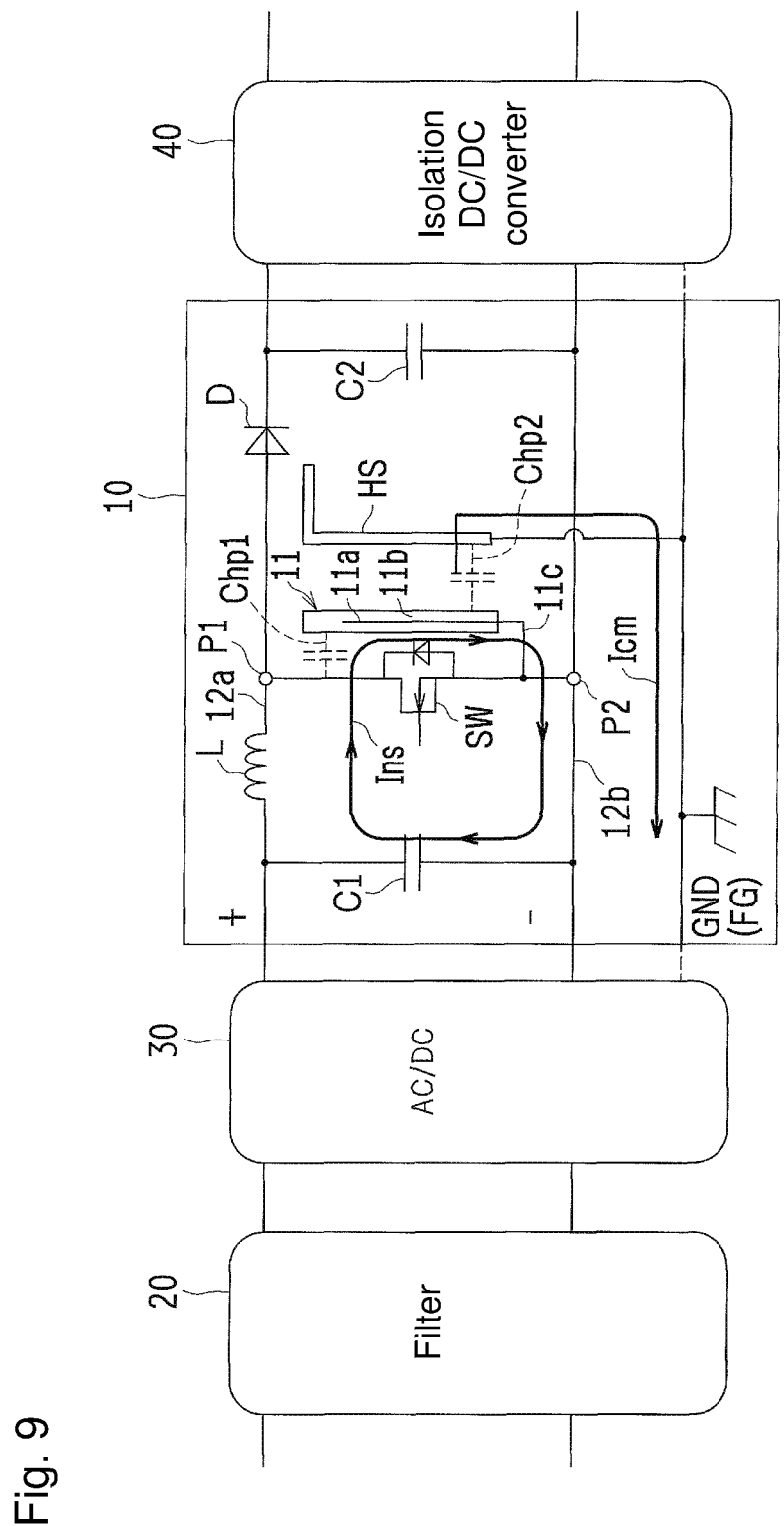
FIG. 9 is an explanatory diagram schematically illustrating an example of a control system using a heatsink and a noise eliminator in a circuit diagram related to a power converter according to one or more embodiments.

Next, one or more embodiments of a circuit configuration of the power converter 10 in the above-mentioned configuration will be described. FIG. 9 is an explanatory diagram schematically depicting an example of a control system using a heatsink HS and a noise eliminator 11 in a circuit diagram related to the power converter 10 according to one or more embodiments. In the form exemplified in FIG. 9, there are used a filter 20 connected to an AC power source (not shown), an AC/DC converter 30 such as a diode bridge which converts alternate current supplied from the AC power source, to the DC current, the power converter 10 which performs power conversion such as smoothing and boosting of a voltage, and an isolation DC/DC converter 40 such as a transformer which performs conversion to a voltage and a current of a specification depending on a power load (not shown). The DC current converted from alternate current by the AC/DC converter 30 has a pulsating current in which the minus voltage of the alternate current output from the filter 20 side is reversed, and the DC current converted from alternate current has the same polarity but changes in the magnitude. Then, the power converter 10 smooths the DC voltage supplied as a pulsating current.

The power converter 10 is provided with a first line 12a and a second line 12b each connecting an input side connected to the AC/DC converter 30 and an output side connected to the isolation DC/DC converter 40. The first line 12a and the second line 12b are connected to a first potential and a second potential on the input side. The first line 12a is connected to, for example, the plus side as the first potential. The second line 12b is connected to, for example, the minus side as the second potential and is used as a line connected to the stable potential lower than the first potential.

In the power converter 10, a first capacitor C1 is provided, on the input side which receives an input from the AC/DC converter 30, so as to connect between the first line 12a and the second line 12b. Further, on the output side on which outputting to the isolation DC/DC converter 40 is performed, there are provided a boost circuit using a reactor L, the semiconductor switch SW, a rectifier element D, and a second capacitor C2.

The reactor L and the rectifier element D provided as the boost circuit are connected in series on the first line 12a. The rectifier element D is disposed in a direction in which an anode terminal is on the input side and a cathode terminal is on the output side, and the reactor L is connected in series on the anode side. Further, the second capacitor C2 is disposed on the cathode side of the rectifier element D so as to connect between the first line 12a and the second line 12b.

Further, the semiconductor switch SW of the boost circuit is disposed so as to short-circuit between the first line 12a and the second line 12b. For a circuit exemplified in FIG. 5, a MOSFET using a reverse parallel diode is used as the semiconductor switch SW. The drain terminal of the semiconductor switch SW is connected to a first point P1 of the first line 12a which is between the reactor L and the rectifier element D, and the source terminal is connected to a second point P2 of the second line 12b. Note that the second point P2 is located between the connection point at which the first capacitor C1 is connected to the second line 12b and the connection point at which the second capacitor C2 is connected to the second line 12b.

In FIG. 9, the heatsink HS disposed in the vicinity of the semiconductor switch SW is depicted on the right side of the semiconductor switch SW, and the noise eliminator 11 is disposed between the semiconductor switch SW and the heatsink HS. The heatsink HS is connected to the FG (frame ground) at the ground potential. The conductive member 11a of the noise eliminator 11 is connected to the second line 12b from the connecting line 11c through the on-board line B1 shown in FIG. 5 and other drawings.

In addition to the above-described various types of elements, a first parasitic capacitance Chp1 is generated between the conductive member 11a of the noise eliminator 11 and the semiconductor switch SW, and a second parasitic capacitance Chp2 is generated between the conductive member 11a of the noise eliminator 11 and the heatsink HS.

Through the first parasitic capacitance Chp1 generated between the conductive member 11a of the noise eliminator 11 and the semiconductor switch SW, a voltage fluctuation at the first point P1 is transferred from the conductive member 11a to the second line 12b through the second point P2, and a noise current Ins flows. However, the noise current Ins transferred to the second line 12b circulates flowing through the second point P2, the capacitor C1, the reactor L, and the first point P1 and is enclosed in the circuit configured with these elements; therefore, the noise current Ins is not output as noise to the input side of the power converter 10.

Further, through the second parasitic capacitance Chp2 generated between the conductive member 11a of the noise eliminator 11 and the heatsink HS, a voltage fluctuation at the second point P2 is transferred from the heatsink HS to the FG, and a common mode current Icm flows as noise. In this case, a magnitude of the flowing common mode current Icm can be represented by the following Equation (1).

$$Icm = Chp2 \times dV/dt \qquad \text{Equation (1)}$$

where
Icm is the common mode current,
Chp2 is the parasitic capacitance between the conductive member 11a and the heatsink HS,
V is the voltage V2 at the second point P2, and
t is time.

Figure 10:
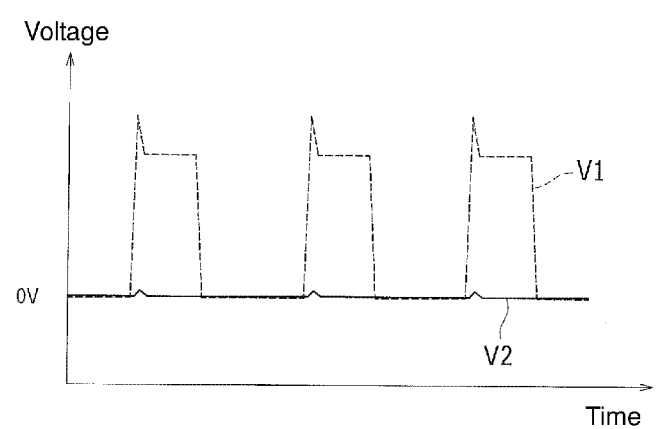
FIG. 10 is a graph illustrating an example of a temporal change in a voltage of a power converter.

The voltage at the second point P2 shown in Equation (1) will be described. FIG. 10 is a graph showing an example of a temporal change in a voltage of the power converter 10. In FIG. 10, the horizontal axis represents time, the vertical axis represents voltage, and the temporal change of the voltage V2 at the second point P2 is represented by a solid line. Further, for the purpose of comparison, the temporal change of the voltage V1 at the first point P1 is represented by a broken line. FIG. 10 clearly shows that the temporal change of the voltage V2 at the second point P2 is smaller than the temporal change of the voltage V1 at the first point P1. Therefore, because the value of dV/dt in Equation (1) caused by the temporal change at the second point P2 is smaller than the value caused by the temporal change at the first point P1, the common mode current Icm is smaller. That is, in the case that there is almost no change at the second point P2 connected to the stable potential as exemplified in FIG. 10, even if the common mode current Icm is output as noise to the input side of the power converter 10, the common mode current Icm is negligibly small.

As described above, in the power converter 10 described in the present application, the noise eliminator 11 in which the conductive member 11a is covered with the insulator 11b is disposed between the semiconductor switch SW and the heatsink HS, and the conductive member 11a is connected to a line. With this arrangement, it is possible to enclose in the power converter 10 the noise current Ins due to the first parasitic capacitance Chp1 generated between the conductive member 11a of the noise eliminator 11 and the semiconductor switch SW. Further, when the conductive member 11a is connected to the second line 12b as the stable potential, it is possible to reduce the common mode current Icm due to the second parasitic capacitance Chp2 generated between the conductive member 11a of the noise eliminator 11 and the heatsink HS. In addition, even when the conductive member 11a and the insulator 11b constituting the noise eliminator 11 is made thin, noise can be reduced; therefore, there are advantages, for example, that temperature rise can be reduced and that production cost can be reduced. Further, because the heatsink HS can be connected without any problem to the FG so that the heatsink HS is at the same potential as the power converter 10, there are advantages that the distance can be arbitrarily selected without being limited by a standard with respect to an insulation distance, that the components can be highly freely arranged, and that downsizing is possible.

The present invention is not limited to the above-described embodiments and can be carried out in various forms. Therefore, the above-mentioned embodiments are just examples at any points and should not be restrictively interpreted. The scope of the present invention is defined by the accompanying claims and is not limited to the main body of the specification at all. Further, deformations and variations within the scope of the equivalents of the claims are all within the scope of the present invention.

For example, as long as the conductive member 11a is disposed between the semiconductor switch SW and the heatsink HS and the insulator 11b is disposed as an insulating film between the conductive member 11a and the semiconductor switch SW and between the conductive member 11a and the heatsink HS, the conductive member 11a and the insulator 11b can be appropriately designed. For example, the shape does not have to be a thin-film shape. The shape may be a bulk form having some thickness or a hard flat-plate shape, and in order to improve the thermal conductivity, the shape may be formed to have a surface shape such as a curved surface or concavities and convexities, which are different from a flat plane. Further, instead of covering the conductive member 11a with the insulator 11b, the insulator 11b may be stuck as an insulating film on each side of the conductive member 11a.

In the form described in the above embodiments, only one end of the pivot support pin B3 is fixed on the on-board line B1; however, the present invention is not limited to this form and can be developed into various forms. For example, the both ends of a U-shaped engagement member may be fixed on the on-board line B1, and the annular terminal 11d may be freely fit to a ring-shaped engagement member. Further, if the connecting line 11c can be freely movably engaged with the engagement member, the present invention can be developed into various forms. For example, two guide pins may be vertically provided as the engagement member on the circuit board B, and a terminal may be used such that the terminal is held between the guide pins and such that the terminal is guided in the guide pins' direction.

Further, the above embodiments may be combined in various manners. For example, one or more embodiments can be developed into various combinations. For example, it is possible to use a connecting line 11c having a bellows-shaped bellows member and a helical-shaped helical member.

In the form described in the above embodiments, the heatsink HS is connected to the FG; however, the heatsink HS can be designed to be connected to a SG (signal ground) or a ground potential such as a ground instead of the FG, or can be designed to be connected to other potentials which can provide a similar effect.

Further, the power converter 10 according to the present invention is not limited to the above-described embodiments and can be applied, to a technical field such as power electronics, as various devices such as a DC-AC inverter and a DC chopper which use a semiconductor switch.

DESCRIPTION OF SYMBOLS 10 power converter
11 noise eliminator
11a conductive member
11b insulator (insulating film)
11c connecting line
11d annular terminal
12a first line
12b second line
B circuit board
B1 on-board line
B2 line terminal
B3 pivot support pin (engagement member)
Chp1 first parasitic capacitance
Chp2 second parasitic capacitance
HS heatsink (radiator)
SW semiconductor switch

The invention claimed is:

1. A power converter comprising:
a conductive line provided on a circuit board;
a switching element provided on the circuit board and connected to the conductive line;
a radiator provided on the circuit board;
an engagement member provided on the circuit board and electrically connected to the conductive line; and
an insertion member provided between the switching element and the radiator, the insertion member comprising:
a conductive member;
an insulator provided between the conductive member and the switching element and between the conductive member and the radiator; and
a connecting line, which is flexible and electrically connects the conductive member and the conductive line to each other, the connecting line comprising a terminal contacting the engagement member, the terminal being freely movable relative to the engagement member, wherein the engagement member comprises a pivot support pin one end of which is fixed to the conductive line, and
the terminal included in the connecting line comprises a through hole provided therein, the through hole being freely fit to the pivot support pin.

2. The power converter according to claim 1, wherein the connecting line comprises a bellows shaped member.

3. The power converter according to claim 1, wherein the connecting line comprises a helical shaped member.

4. The power converter according to claim 1, wherein the conductive line comprises a pair of conductive lines connecting between an input side and an output side,
the switching element is provided to short-circuit between the pair of conductive lines,
one of the pair of conductive lines is connected to a stable potential,
the connecting line electrically connects the conductive member to the one of the pair of conductive lines connected to the stable potential, and
the radiator is electrically connected to a predetermined potential.

5. The power converter according to claim 1, wherein the connecting line comprises a bellows shaped member formed.

6. The power converter according to claim 1, wherein the connecting line comprises a helical shaped member.

7. The power converter according to claim 2, wherein the connecting line comprises a helical shaped member.

8. The power converter according to claim 5, wherein the connecting line comprises a helical shaped member.

* * * * *